United States Patent [19]

Mu et al.

[11] Patent Number: 4,980,018
[45] Date of Patent: Dec. 25, 1990

[54] PLASMA ETCHING PROCESS FOR REFRACTORY METAL VIAS

[75] Inventors: Xiao-Chun Mu, Saratoga; Jagir Multani, Fremont, both of Calif.

[73] Assignee: Intel Corporation, Santa Clara, Calif.

[21] Appl. No.: 436,429

[22] Filed: Nov. 14, 1989

[51] Int. Cl.$^5$ ........................................... H01L 21/306
[52] U.S. Cl. ................................... 156/643; 156/626; 156/664
[58] Field of Search ............... 156/626, 643, 646, 650, 156/668, 664; 356/346; 73/26

[56] References Cited

U.S. PATENT DOCUMENTS

| | | | |
|---|---|---|---|
| 4,358,338 | 11/1982 | Downey et al. | 156/643 |
| 4,359,816 | 11/1982 | Abbas et al. | 156/643 |
| 4,502,913 | 3/1985 | Lechaton et al. | 156/643 |
| 4,556,628 | 12/1985 | Greshner et al. | 156/643 |
| 4,687,539 | 8/1987 | Burns et al. | 156/345 |
| 4,713,141 | 12/1987 | Tsang | 156/643 |

FOREIGN PATENT DOCUMENTS

55-63830  5/1980  Japan .................. 156/626

OTHER PUBLICATIONS

Khoury, IBM Technical Disclosure Bulletin, vol. 25, No. 11A, 4/1983, "Real-Time Etch Plasma Monitor System", pp. 5721-5723.

*Primary Examiner*—Kenneth M. Schor
*Assistant Examiner*—John J. Bruckner
*Attorney, Agent, or Firm*—Blakely, Sokoloff, Taylor & Zafman

[57] ABSTRACT

An etchback process for etching a refractory metal layer formed on a semiconductor substrate with a greatly reduced micro-loading effect. The etch proceeds in three steps. The first step is a uniform etch which utilizes a gas chemistry of $SF_6$, $O_2$ and He and proceeds for a predetermined time to remove most of the metal layer. The second step is a very uniform etch which utilizes a gas chemistry of $SF_6$, $Cl_2$ and He and proceeds until the endpoint is detected. The endpoint is detected by measurement and integration of the 772 nm and 775 nm lines of Cl. The third step is a timed etch utilizing a gas chemistry of $Cl_2$ and He which is used as both an overetch to ensure complete removal of the refractory metal film and as a selective etchant to remove an adhesion underlayer.

26 Claims, 2 Drawing Sheets

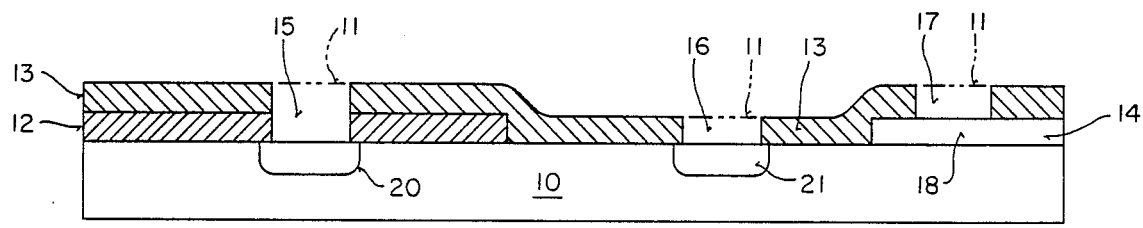
FIG _ 1
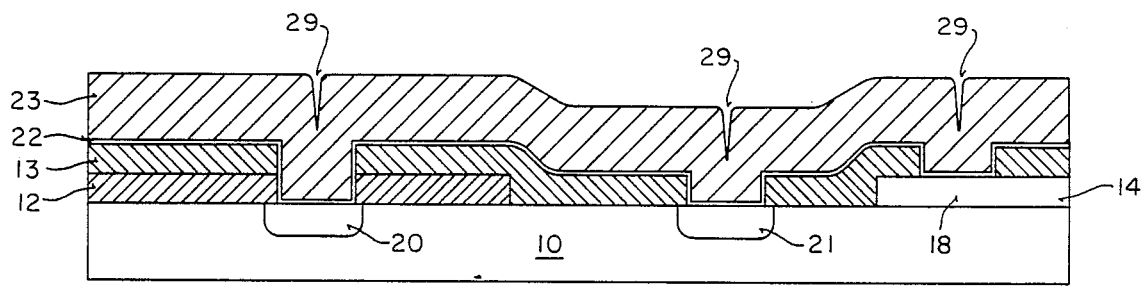
FIG _ 2
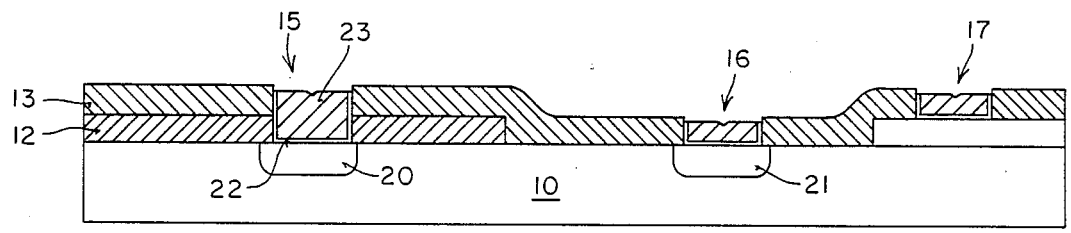
FIG _ 3

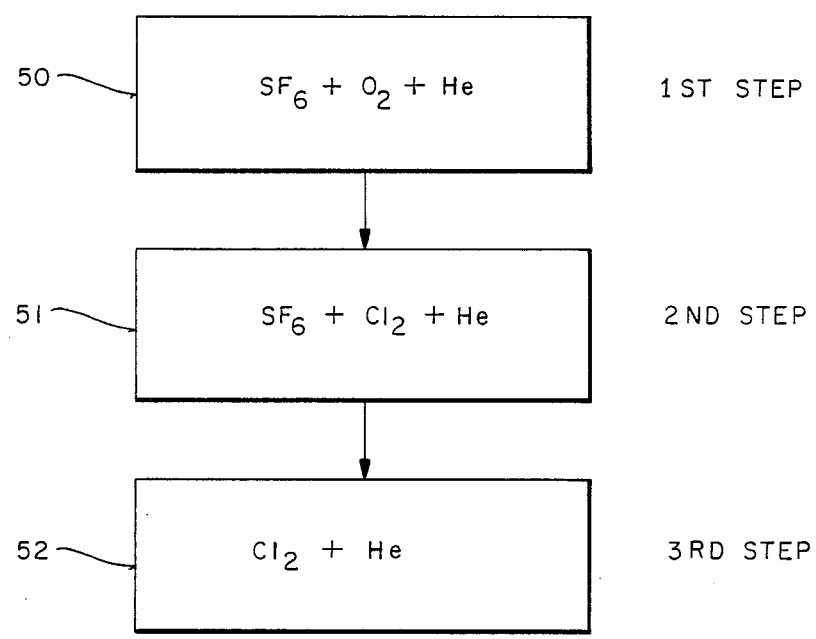
FIG_4

PLASMA ETCHING PROCESS FOR REFRACTORY METAL VIAS

BACKGROUND OF THE PRESENT INVENTION

1. Field of the Invention

This invention relates to the filed of semiconductor devices and more specifically to an etchback process designed to etch a blanket layer of a refractory metal such as tungsten (W).

2. Prior Art

In the manufacture of semiconductor devices, there is a need to make electrical contact to certain regions of the device. Normally, it is necessary to make contact to device regions underlying a dielectric on the surface of the silicon substrate by first forming an opening or via in the dielectric over the region to be contacted and next depositing a conductive material over the substrate surface, including the opening or via. This conductive material is then patterned for connecting different parts of the integrated surface (that is, to form "interconnects" or "interconnect lines"). Traditionally, sputtered aluminum (Al) has been used as the conductive material. Typically, a blanket layer of aluminum is deposited on the surface of the silicon substrate covering any overlying dielectric as well as device regions exposed by openings in the dielectric. This is followed by a masking step which leaves photoresist covering the openings or vias through the dielectric layer to the region to be contacted and the regions to be used as interconnects. An etch step removes the aluminum from the areas not covered by photoresist, leaving the aluminum which fills the openings or vias and forms the interconnect lines, thereby making electrical contact to the desired region.

As geometries have shrunk to submicron levels and devices have become more densely packed on the substrate surface, the openings or vias to the device regions to be contacted have increasingly greater aspect ratios (ratio of height to width). Aluminum deposition alone has proven to be inadequate in devices with high aspect ratios. The problems encountered include poor step coverage, poor contact integrity, and inadequate planarity.

To overcome these shortcomings, tungsten and other refractory metals are being used as a contact filling for devices with submicron contacts before aluminum deposition and patterning. For example, a blanket tungsten layer (tungsten "film") is deposited followed by a blanket etchback to remove deposited tungsten from the surface of the substrate, leaving a tungsten filling or plug in the contact openings or via. The aluminum layer is then deposited, covering the substrate surface including the filled contact vias. This aluminum film is then patterned and etched to form the interconnects.

A problem encountered with the tungsten process is the "micro-loading effect" where the tungsten etch rate drastically accelerates in the contact opening when the bulk of the film has been removed from the surface of the silicon substrate (that is, when the film "clears"). The result is that the contact fillings or plugs are recessed below the surface of the dielectric and are sometimes completely removed by the end of the etch. Because of the micro-loading effect, it is extremely difficult to obtain uniform contact fillings while ensuring that the bulk of the metal is completely removed from all areas of the substrate. Slight non-uniformities in the metal thickness or etching process over the surface of the wafers will cause the bulk metal on the surface of the substrate to be etched in some areas of the substrate before others. If even a slight overetch is employed to ensure complete etching of the bulk metal from all areas of the surface, the metal filling the contact openings will begin to etch rapidly in those regions of the surface where the bulk metal clears first. This results in extreme variations or non-uniformities in the filling levels of the contact openings. The filling in the contact openings located in the area where the bulk metal cleared last will be completely unetched - that is, the contact openings in this area will be completely filled with tungsten, while the filling in the contact openings in areas where the bulk metal cleared earlier will be etched to different extents - some will be recessed slightly below the surface, others will be recessed to greater depths and some will be missing entirely.

What is needed is an etchback process which completely removes the bulk metal from the surface of the wafer but does not result in partially or completely etched away contact fillings due to the micro-loading effect.

Various etching methods have been described to overcome the micro-loading effect. For example in "A Study of Tungsten Etchback for Contact and Via Fill Applications" *Proc. IEEE V-MIC conf.* p193 (Jun. 15-16, 1987), a three step etching process utilizing an aluminum underlayer and a gas chemistry including $CBrF_3$ is described. There are several drawbacks to this method. The use of an aluminum underlayer as an etch stop requires additional processing steps. The use of $CBrF_3$ for the etching gas can lead to polymer formation in the etcher chamber, resulting in increased equipment maintenance requirements. The low etch rate of one thousand to three thousand angstroms per minute leads to a low throughput, making the process undesirable for mass IC production.

Another method of avoiding the micro-loading effect is described in "Layer Tungsten and Its Applications for VLSI Interconnects" *IEEE IEDM Technical Digest*, p462 (1988). The method there described is to interrupt the tungsten deposition and deposit thin interlayers of polysilicon. A tungsten layer of approximately one thousand angstroms is deposited followed by a polysilicon layer of about 150 angstroms. This is repeated until the desired final tungsten thickness is reached. The tungsten layers are then removed by an etchback. The etch is stopped at the last polysilicon layer, leaving the first deposited metal layer intact. Although the contact fillings remain, with no micro-loading, this process is not useful for IC production since the last layer of tungsten which is not etched from the surface of the substrate will cause short circuits between contacts, if not etched during the subsequent aluminum etch.

It is also well known to planarize the surface with photoresist after tungsten deposition and employ an etch that etches photoresist and tungsten at approximately the same rate. See "Plasma Etching Methods for the Formation of Planarized Tungsten Plugs Used in Multilevel VLSI Metallizations" *J. Electrochem. Soc.*, Vol. 135. p936 (1988) and "Planarized Contact Process for Submicron VLSI Devices Using Resist Etch Back of CVD Tungsten" ECS Fall Meeting, Extended Abstract, Vol. 251, p356 (1988). When utilizing this method, it is critical to maintain a uniform etch process so that the entire surface clears at the same time. If some areas of the surface clear before other areas, the micro-loading effect will cause recessed or missing contact fillings in the area first cleared. Maintaining such a uniform etch repeatably is difficult, even in single wafer etchers where control of the etching process is generally good. Additionally, photoresist or organic residue frequently remain at the top of the contact filling which can be the source of contamination during later processing steps, leading to reliability problems in the devices.

Finally, a sacrificial $Si_3N_4$ layer, deposited before metal deposition, is known to reduce the micro-loading effect. See "A Novel Tungsten Etchback Scheme" *Proc. IEEE V-MIC conf.* p129(Jun. 12–13, 1989). The disadvantage of the scheme described therein is that process complexity is increased by adding the $Si_3N_4$ deposition and removal steps. The $Si_3N_4$ removal requires the use of phosphoric acid. Phosphoric acid is generally high in particle content and can cause contamination leading to device reliability problems. Because phosphoric acid is highly viscous, efficient filtration is difficult and expensive. Furthermore, some tungsten residue often remains on the $Si_3N_4$ layer after etchback. This tungsten residue masks portions of the $Si_3N_4$ layer during the $Si_3N_4$ removal step, leaving islands of $Si_3N_4$ covered with tungsten remaining on the substrate surface after the $Si_3N_4$ removal.

What is needed is an etchback process that does not suffer from the micro-loading effect, that is, a process which can ensure complete removal of the bulk metal from the surface of the substrate while leaving the contact fillings uniform. It is further desirable that the etching process does not add additional steps or complexities to the process, and has a sufficiently low throughput time to allow for high volume IC production.

SUMMARY OF THE INVENTION

The present invention describes a process for uniformly etching back a refractory metal layer on a semiconductor substrate with minimal micro-loading effect.

The etch proceeds in three steps. The first step utilizes a sulfur hexafluoride ($SF_6$), oxygen ($O_2$) and helium (He) gas chemistry at high process pressure and high gas flow rate, and proceeds for a predetermined time to remove about 70% of the thickness of the metal film. The gas chemistry and process parameters used in this step have resulted in an extremely uniform etch across the surface of the substrate compared with prior art etching techniques. This increase in etching uniformity contributes to the reduction of the micro-loading effect by minimizing the time of overetch of exposed contact openings.

The second step is carried out using a gas chemistry including $SF_6$, chlorine ($Cl_2$) and He. The second etch step uses a high gas pressure and a high gas flow rate. The gas chemistry and process parameters of the second step have been found to greatly reduce the micro-loading effect. The endpoint of the second etch is detected by measurement and integration of the 772 nm and 775 nm emission lines of chlorine. The endpoint detection of the present invention is more sensitive than that used in prior art etching processes because measurement and integration of these lines results in an endpoint signal two to three times stronger than that obtained with the use of the conventional 704 nm emission line of fluorine for endpoint detection. This increase in sensitivity allows more accurate identification of the endpoint, reducing the possibility of overetching.

The third step of the process is a short timed etch. This step provides a short overetch to ensure complete removal of the metal layer, as well as a means for removing an adhesion underlayer. The third step utilizes a gas chemistry including $Cl_2$ and He. This chemistry etches titanium or titanium nitride faster than tungsten and will therefore remove an adhesion underlayer made of titanium or titanium nitride with minimal etching of tungsten contact fillings.

The present invention describes a three step etch process in which the first step etches the bulk of a refractory metal layer such as tungsten with extremely good uniformity. The second step utilizes a gas chemistry and process parameters which minimize the micro-loading effect, allowing the metal layer to be removed from the surface of a semiconductor substrate without etching the metal filling in the contact openings. The third step selectively etches an adhesion underlayer, with insignificant etching of the tungsten contact fillings. In this way the present invention removes the tungsten metal from the entire surface of a silicon substrate and leaves uniformly filled contact openings.

BRIEF DESCRIPTION OF THE DRAWINGS

FIG. 1 is a cross-sectional elevation view of a substrate with dielectric layers, a metal layer, device regions, and contact openings formed through the dielectric layers to interlevel layers and device regions.

FIG. 2 illustrates the structure of FIG. 1 with an adhesion underlayer and a refractory metal layer formed thereon.

FIG. 3 illustrates the structure of FIG. 2 after etchback of the metal layer and metal underlayer from the surface of the substrate, leaving the contact openings filled with the refractory metal.

FIG. 4 illustrates the steps in the preferred embodiment of the novel etching process.

DETAILED DESCRIPTION OF THE PRESENT INVENTION

An invention is described for uniformly etching back a refractory metal film such as tungsten (W) from the surface of a semiconductor substrate leaving the contact openings or vias uniformly filled by tungsten. In the following description, numerous specific details are set forth such as specific thicknesses, etc. in order to provide a thorough understanding of the present invention. It will be obvious, however, to one skilled in the art, that the present invention may be practiced without these specific details. In other instances, well-known process steps have not been described in detail in order not to unnecessarily obscure the present invention.

FIG. 1 shows semiconductor substrate 10 with dielectric layers 12 and 13, which can be any dielectric material such as silicon dioxide ($SiO_2$) (doped or undoped), or silicon nitride ($Si_3N_4$), and interlevel metal layer 14. Metal layer 14 may be a previously etched layer and can be made from, for example a refractory metal, refractory metal silicide or aluminum. Dielectric layers 12 and 13 and metal layer 14 are formed using well known prior art deposition techniques.

Also shown in FIG. 1 are contact openings 15, 16 and 17 disposed through the dielectric layers 12 and 13. Contact openings 15, 16 and 17 are formed using well-known prior art photolithographic and etching techniques. The contact openings may be made through one dielectric layer (for example contact opening 16) or through more than one layer of dielectric (for example contact opening 15). The contact openings may contact substrate 10 (for example contact openings 15 and 16), or may contact an interlevel layer (for example contact opening 17, which contacts region 18). It will be appreciated that there are many such contact openings on the surface of the substrate 10, and only a small fraction of the substrate 10 is shown in the FIGS. 1–3.

Contact openings 15, 16 and 17 are to be filled with tungsten so that electrical contact can be made to the underlying regions 20, 21 and 18 respectively. Contact may be made for example to an n or p region in the substrate as shown for regions 20 and 21, or to an interlevel metal layer such as at region 18 of layer 14. The width and depth of contact openings 15, 16 and 17 are typically in the range of approximately 0.5 microns to 1.5 microns.

It is desirable to fill contact openings 15, 16 and 17 to approximately the surface of the uppermost dielectric layer defining the opening. That is, the tungsten contact filling or plug should be approximately flush with the surface of dielectric layer 13 of FIG. 1 in the region of each contact opening. This is shown as dotted line 11 for contact openings 15, 16 and 17 of FIG. 1. In practice, the contact fillings do not need to be perfectly flush with the surface of the uppermost dielectric layer (that is, the contact filling does not need to fill all the way up to line 11), but are acceptable from both a process and device perspective if recessed no more than 0.2 microns below, for example, line 11. Provided, however, the recesses are consistent. That is, all contact fillings over the entire surface of substrate 10 should be recessed no more than 0.2 microns.

FIG. 2 shows the silicon substrate of FIG. 1 after deposition of an underlayer 22 and refractory metal layer 23. Underlayer 22 may be, for example, titanium (Ti), titanium tungsten (TiW) or titanium nitride (TiN). The underlayer 22 is often referred to as an "adhesion" or "glue" layer. The thickness of underlayer 22 is approximately less than 1000 Angstroms in the currently preferred embodiment. The present invention has been practiced with the refractory metal layer 23 formed of tungsten, but it is anticipated that the present invention will give similar results for etching other refractory metals, with minor adjustments in operating parameters as can be performed by one of ordinary skill in the art. The thickness of tungsten layer 23 is generally 5000 to 20,000 angstroms and is typically about 10,000 angstroms in the currently preferred embodiment.

The deposited tungsten layer 23 of FIG. 2 is not planar but generally follows the contours of the surface as shown in region 14. However, because of the small size of the contact openings 15, 16 and 17, and because deposition occurs on the side walls of the contact openings 15, 16 and 17 at the same time as deposition on the bottom, the tungsten deposition proceeds more quickly in the contact openings 15, 16 and 17 than on the surface of substrate 10. The size of the resulting depressions 29 ("dimples") in the tungsten layer 23 over the contact openings 15, 16 and 17 is therefore much smaller than the size of the contact openings 15, 16 and 17 themselves. That is depressions 29 will not be as deep or as wide as its respective contact opening 15, 16 or 17, but will generally be about 0.2 microns in width.

The tungsten layer 23 is next etched back. In general, the thickness of tungsten layer 23 is initially equal at all points on the surface. That is, the thickness from the upper surface of the tungsten layer to the upper surface of the dielectric is approximately equal on all areas of substrate 10 with the minor variations due to depressions 29 as noted above and minor process variations. Therefore, when an etchback procedure is used that uniformly etches tungsten layer 23, the tungsten on the dielectric surfaces of substrate 10 will generally clear at approximately the same time in all areas of the substrate 10, and at the time of clearing the tungsten in the contact openings 15, 16 and 17 will be approximately flush with the surrounding upper most dielectric layer.

The present invention utilizes a three step etching process in the currently preferred embodiment, shown as steps 50, 51 and 52 in FIG. 4. In the following description numerous details including flow rates, pressures and power levels are given. It will be obvious to one skilled in the art however, that these may be varied within the spirit and scope of the invention and still achieve the objects of the invention.

The etchback is carried out in the currently preferred process in a commercially available single wafer etcher such as the Lam Research Corporation Autoetch 490. The first step 50 of FIG. 4 uses a gas chemistry of $SF_6$, $O_2$ and He. In the currently preferred embodiment, the flow rate of $SF_6$ is 160 standard cubic centimeters per minute (SCCM), the flow rate of $O_2$ is 20 SCCM, and the flow rate of He is 150 SCCM. Also in the currently preferred embodiment the process pressure is 700 mTorr and the process power is 400W. The electrode distance (distance between the anode and cathode of the etcher) is 0.7 cm. The above parameters may be varied within a certain range. The optimum operating parameters and the range of acceptable operating parameters are set forth in Table 1 below. The optimum is set forth in the first column and approximate range in which the invention is preferred is set forth in the second column. In the currently preferred embodiment this first etch is a timed etch designed to remove 70% of the total tungsten layer 23 thickness. For example, for a tungsten film of 10,000 angstroms this etch would remove 7,000 angstroms and would take approximately 1.0 minute.

This first etch is a very uniform etch. In practice, a uniformity of ±6% (3 sigma) across the substrate has been attained. In prior art etching techniques, the etch rate in the center is much lower than at the edges of the substrate, resulting in typical uniformities of approximately 15%. This increase in etching uniformity of the present invention contributes to the reduction of the micro-loading effect by minimizing the time of overetch of exposed contact openings. Although the exact chemistry and physics are not precisely known, it is believed that the high pressure and high gas flow rate are responsible by confining the plasma and the reactive species to the small volume between the plates (the anode and cathode) of the etcher. Due to this confinement, the plasma is more stable, thus maintaining the availability of reactive species at a constant, uniform level over the surface of the substrate.

The second step 51 occurs immediately after the first step without removing the wafer from the etching chamber in the currently preferred embodiment. The second step 51 is carried out in $SF_6$, $Cl_2$ and He. In the currently preferred embodiment, the flow rate of $SF_6$ is 130 SCCM, the flow rate of $Cl_2$ is 70 SCCM, and the flow rate of He is 200 SCCM. Also in the currently preferred embodiment the process pressure is 700 mTorr and the process power is 250W. The electrode distance is 0.7 cm. The above parameters may be varied within a certain range. The optimum operating parameters and the range of operating parameters for the currently preferred process are set forth in Table 2 below. The optimum is set forth in the first column.

The micro-loading effect is greatly reduced in this second etch compared with prior art etching processes. As described above, the micro-loading effect is an accelerated etch rate at the contact openings 15, 16 and 17. This effect can be measured by determining the etch rate (in microns/minute for example) in the contact openings 15, 16 and 17 compared with the etch rate on the surface of substrate 10. A ratio of 1.0 would indicate the complete absence of the micro-loading effect. In prior art etchback techniques, this ratio is typically about 2.5 or more. That is, the tungsten in the contact openings etches at a rate 2.5 or more times greater than the tungsten remaining on the surface of substrate 10. In the present invention, the ratio has been greatly reduced to approximately 1.2. It has been determined that the use of a $SF_6$, $Cl_2$ and He gas chemistry, and the use of high gas flow rates are responsible for most of the reduction in the micro-loading effect. The relative flow rates of the gases and the use of a high process pressure also have been found to contribute to the reduction in the micro-loading effect.

Although the precise chemical and physical mechanisms responsible for the reduction in the micro-loading effect are not known, it is believed that the use of $Cl_2$ causes the etch to be anisotropic—that is, the etch rate in the direction perpendicular to the substrate surface is much greater than the etch rate parallel to the substrate surface. This reduces the effect of the depressions 29 in causing the micro-loading effect because in an isotropic etch (equal etch rate in both directions) the sides of depressions 29 etch at the same rate as the surface of the bulk metal, leading to a widening and deepening gap in the area of the contact fillings as the etch proceeds. Potentially, the metal in the contact fillings could be completely removed in a isotropic etch.

It is further believed that the high flow rate ensures that the residence time of the active species is less than the life time of the reactive species. Because of this, the etch reaction rate is not limited by the lifetime of reactant species but by convection of the reactant species through the chamber. Under these conditions the micro-loading effect is greatly reduced. The etch rate can be calculated as follows:

$$R = BtG/(1 + KBtA)$$

where R is the etch rate, B, G and K are constants, t is the active species life time, and A is the exposed area to be etched. By replacing t, the active species lifetime, with a smaller, "convection" lifetime the effect of the term in the denominator with exposed area is made small compared with 1, thus minimizing the effect of exposed area on etch rate.

The endpoint of the second etch is detected by measurement and integration of the 772 nm and the 775 nm emission lines of chlorine. In prior art processes where a fluorine containing gas is used as the sole etchant, it is customary to measure the 704 nm emission line of fluorine. In either case, when the bulk of the tungsten layer 23 has been removed, there is an increase in the number of unreacted chlorine or fluorine atoms in the chamber. The increase in the number of unreacted Cl or F can be detected by measurement of the emission lines of the Cl or F. The emission lines can be measured using commercially available equipment such as the Xinix 1014 endpoint controller. Since the above mentioned commercially available endpoint detector has a band pass width of 10 nm, it is possible to measure and integrate both the 772 nm and 775 nm lines of chlorine and therefore get a much stronger signal of when the endpoint has occurred than using prior art detection of the single 704 nm emission line of fluorine. The endpoint is therefore more quickly and accurately detected. Because the endpoint is more quickly detected, it is easier to stop the etch without allowing a significant, unintended overetch. This gives an additional advantage over prior art etching processes where a significant portion of the contact filling may be etched before the endpoint is detected.

Normally, it is possible for the endpoint to be detected when there is still a slight amount of bulk metal on some areas of the surface of substrate 10, or an adhesion layer such as underlayer 22 which may cause shorts between contacts. In many prior art processes, the etch is allowed to proceed beyond the detected endpoint. This has the disadvantage that the tungsten in contact openings located in areas of substrate 10 where the metal layer 23 has cleared will continue to etch, usually at a rapid rate.

In the present invention, a third short timed etch (step 52 of FIG. 4) using a chemistry which does not etch tungsten rapidly is performed immediately following the second etch (step 51 of FIG. 4), without removing the substrate 10 from the etcher chamber in the currently preferred embodiment. The gas chemistry in the third etch is $Cl_2$ and He. In the currently preferred embodiment, the flow rate of $Cl_2$ is 130 SCCM, and the flow rate of He is 50 SCCM. Also in the currently preferred embodiment the process pressure is 400 mTorr and the process power is 200 W. The electrode distance is 0.55 cm. The optimum operating parameters and the range of operating parameters for the currently preferred process are set forth in Table 3 below. The optimum is set forth in the first column. In the currently preferred embodiment, this etch is carried out for the time of 35 seconds. The particular gas chemistry of this step is very selective in etching titanium or titanium nitride over tungsten. Therefore, when a titanium or titanium nitride under layer has been used as underlayer 22, this etch will remove underlayer 22 without causing additional significant etching of the tungsten contact fillings.

After these three etch steps, the semiconductor substrate 10 appears as is shown in FIG. 3. The contact openings 15, 16 and 17 are now filled with tungsten. There are small depressions at the contact opening. In general, these depressions are less than 0.2 microns deep over the entire surface of the wafer. That is, extremely good uniformity in contact filling is achieved.

The above 3 step etch process describes in the currently preferred embodiment of the present invention. It will be obvious, however, that it is not necessary to practice all of the above steps to achieve the objects of the invention. For example, it has been found that the chemistry of $SF_6$, $Cl_2$ and He, along with the use of flow rates in the ranges given in Table 2, will significantly reduce the micro-loading effect. Similarly, the use of the measurement and integration of the 772 nm and 775 emission lines of chlorine to detect an endpoint in a process utilizing a chlorine containing etchant gas will reduce overetching by more precisely determining the etch endpoint compared with prior art methods. Additionally, in a process utilizing a Ti, TiW or TiN underlayer and a tungsten metal layer to form the contact filling, the use of a final etch step utilizing a gas chemistry of $Cl_2$ and He, along with the process parameters given in Table 3, will reduce overetch of the tungsten contact filling compared with the prior art technique of performing an overetch utilizing the same gases and parameters as were used in the etch to remove the bulk of the metal layer.

In the present invention, the chemistry of $SF_6$, $O_2$ and He, and the high flow rate and pressure in the first step 50 result in uniform etching of the bulk of the tungsten layer 23. The uniform etch in turn reduces the time between the first area of substrate 10 to clear and the last area to clear. This reduces the time the contact fillings are exposed to etchant gases, thereby reducing the recessions at the contact openings in the areas first cleared and leading to uniformly filled contact openings.

The chemistry of $SF_6$, $Cl_2$ and He, and the process parameters of the second step 51 greatly reduce the micro-loading effect compared with the prior art etching processes. This further reduces the depressions at the contact opening in the areas first cleared and contributes to uniformly filled contact openings. In addition, the second etch is stopped at the proper time because of the more sensitive endpoint detection by use of the Cl emission lines. This also prevents overetching of the contact fillings.

The third etch step 52 removes any remaining portions of tungsten layer 23 as well as underlayer 22. The gas chemistry used in this step selectively etches Ti, TiW or TiN over tungsten, and therefore underlayer 22 will be etched much more quickly than the tungsten forming the contact fillings, further resulting in uniformity and non-etching of the contact filling.

Therefore, a novel etchback technique for etching a tungsten layer uniformly is described.

TABLE 1

|  | Optimum | Range |
| --- | --- | --- |
| $SF_6$ flow | 160 SCCM | 100–300 SCCM |
| $O_2$ flow | 20 SCCM | 10–50 SCCM |
| He flow | 150 SCCM | 100–200 SCCM |
| Process Pressure | 700 mTorr | 60–80 mTorr |
| Process Power | 400 W | 300–500 W |
| Electrode Distance | 0.7 cm | 0.6–0.8 cm |

TABLE 2

|  | Optimum | Range |
| --- | --- | --- |
| $SF_6$ flow | 130 SCCM | 100–200 SCCM |
| $Cl_2$ flow | 70 SCCM | 50–90 SCCM |
| He flow | 200 SCCM | 150–300 SCCM |
| Process Pressure | 700 mTorr | 600–80 mTorr |
| Process Power | 250 W | <300 W |
| Electrode Distance | 0.7 cm | 0.6–0.8 cm |

TABLE 3

|  | Optimum | Range |
| --- | --- | --- |
| $Cl_2$ flow | 130 SCCM | 100–200 SCCM |
| He flow | 50 SCCM | 30–80 SCCM |
| Process Pressure | 400 mTorr | 300–600 mTorr |
| Process Power | 200 W | 150–300 W |
| Electrode Distance | 0.55 cm | 0.5–0.7 cm |

We claim:

1. A process for etching a refractory metal from the surface of a dielectric layer formed on a substrate, said dielectric layer having openings formed therein, said openings exposing regions of said substrate, said refractory metal extending in said openings of said dielectric layer to contact said regions of said substrate, said process comprising the steps of:

providing said substrate having said dielectric layer and said refractory metal on it;

performing a first plasma etch of said refractory metal in a flow of a first mixture consisting essentially of $SF_6$, $O_2$, and He, wherein said first mixture contains substantially no $Cl_2$ with the total pressure of said first mixture being in the range of 600–800 mTorr;

then performing a second plasma etch of said refractory metal in a second mixture consisting essentially of $SF_6$, $Cl_2$, and He, wherein said second mixture contains substantially no $O_2$ with the total pressure of said second mixture being in the range of 600–800 mTorr;

and then performing a third plasma etch of said refractory metal in a flow of a third mixture consisting essentially of $Cl_2$ and He, wherein said third mixture contains substantially no $SF_6$.

2. The process as described in claim 1 wherein said first etch is performed for a predetermined time, said second etch continues until an end point is detected by measurement of emission lines, and said third etch is performed for a predetermined time.

3. The process as described in claim 2 wherein said first etch is carried out at a power in the range of 300–500 Watts, said second etch is carried out at a power less than 300 Watts, said third etch is carried out at a power in the range of 150–300 Watts.

4. The process as described in claim 2 wherein said endpoint is detected by the measurement and integration of emission lines of chlorine, said lines comprising the 772 nm and 775 nm emission lines of chlorine.

5. The process as described in claim 4 wherein said first etch is carried out at a power in the range of 300–500 Watts, said second etch is carried out at a power less than 300 Watts, said third etch is carried out at a power in the range of 150–300 Watts.

6. The process as described in claim 4 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

7. The process as described in claim 6 wherein said first etch is carried out at a power in the range of 300–500 Watts, said second etch is carried out at a power less than 300 Watts, said third etch is carried out at a power in the range of 150–300 Watts.

8. The process as described in claim 2 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

9. The process as described in claim 8 wherein said first etch is carried out at a power in the range of 300–500 Watts, said second etch is carried out at a power less than 300 Watts, said third etch is carried out at a power in the range of 150–300 Watts.

10. The process as described in claim 1 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

11. The process as described in claim 10 wherein said first etch is carried out at a power in the range of 300–500 Watts, said second etch is carried out at a power less than 300 Watts, said third etch is carried out at a power in the range of 150–300 Watts.

12. The process as described in claim 1 wherein said first etch is carried out at a power in the range of 300–500 Watts, said second etch is carried out at a power less than 300 Watts, said third etch is carried out at a power in the range of 150–300 Watts.

13. The process as described in any one of claims 1 through 12 wherein said refractory metal is Tungsten (W).

14. A process for filling openings in a dielectric formed on a substrate, said openings exposing an underlying region on said substrate, said process comprising the steps of:
providing said substrate having a dielectric on it;
depositing a refractory metal on said dielectric and said underlying region to cover said dielectric and said underlying region;
etching said refractory metal covering said dielectric, said etch comprising the steps of:
performing a first plasma etch of said refractory metal in a flow of a first mixture consisting essentially of $SF_6$, $O_2$, and He, wherein said first mixture contains substantially no $Cl_2$ with the total pressure of said first mixture being in the range of 600–800 mTorr;
then performing a second plasma etch of said refractory metal in a flow of a second mixture consisting essentially of $SF_6$, $Cl_2$, and He, wherein said second mixture contains substantially no $O_2$ with the total pressure of said second mixture being in the range of 600–800 mTorr;
and then performing a third plasma etch of said refractory metal in a flow of a third mixture of process gases consisting essentially of $Cl_2$ and He, wherein said third mixture contains substantially no $SF_6$.

15. The process as described in claim 14 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

16. The process as described in claim 15 wherein said first etch is carried out at a power in the range of 300–500 Watts, said second etch is carried out at a power less than 300 Watts, said third etch is carried out at a power in the range of 150–300 Watts.

17. The process as described in claim 14 wherein said first etch is carried out at a power in the range of 300–500 Watts, said second etch is carried out at a power less than 300 Watts, said third etch is carried out at a power in the range of 150–300 Watts.

18. The process as described in claim 14 wherein said first etch is performed for a predetermined time, said second etch continues until an end point is detected by measurement of emission lines, and said third etch is performed for a predetermined time.

19. The process as described in claim 18 wherein said first etch is carried out at a power in the range of 300–500 Watts, said second etch is carried out at a power less than 300 Watts, said third etch is carried out at a power in the range of 150–300 Watts.

20. The process as described in claim 18 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

21. The process as described in claim 20 wherein said first etch is carried out at a power in the range of 300–500 Watts, said second etch is carried out at a power less than 300 Watts, said third etch is carried out at a power in the range of 150–300 Watts.

22. The process as described in claim 18 wherein said endpoint is detected by the measurement and integration of emission lines of chlorine, said lines comprising the 772 nm and 775 nm emission lines of chlorine.

23. The process as described in claim 22 wherein said first etch is carried out at a power in the range of 300–500 Watts, said second etch is carried out at a power less than 300 Watts, said third etch is carried out at a power in the range of 150–300 Watts.

24. The process as described in claim 22 wherein said flow of said $SF_6$ in said first etch is in the range of 100–300 Standard Cubic Centimeters per Minute (SCCM), said flow of said $O_2$ in said first etch is in the range of 10–50 SCCM, said flow of said He in said first etch is in the range of 100–200 SCCM, said flow of said $SF_6$ in said second etch is in the range of 100–200 SCCM, said flow of said $Cl_2$ in said second etch is in the range of 50–90 SCCM, said flow of said He in said second etch is in the range of 150–300 SCCM, said flow of said $Cl_2$ in said third etch is in the range of 100–200 SCCM, and said flow of said He in said third etch is in the range of 30–80 SCCM.

25. The process as described in claim 24 wherein said first etch is carried out at a power in the range of 300–500 Watts, said second etch is carried out at a power less than 300 Watts, said third etch is carried out at a power in the range of 150–300 Watts.

26. The process as described in any one of claims 14–25 wherein said refractory metal is Tungsten (W).

* * * * *